United States Patent [19]
Pas

[11] Patent Number: 5,098,626
[45] Date of Patent: Mar. 24, 1992

[54] METHOD FOR PACKING A MEASURED QUANTITY OF THERMOSETTING RESIN AND OPERATING A MOLD FOR ENCAPSULATING A COMPONENT

[76] Inventor: Ireneus J. T. M. Pas, Kapellenberglaan 44, 6891 AG Rozendaal, Netherlands

[21] Appl. No.: 439,658

[22] Filed: Nov. 22, 1989

[30] Foreign Application Priority Data

Nov. 22, 1988 [NL] Netherlands .................. 8802879

[51] Int. Cl.$^5$ ............... B29C 31/06; B29C 45/02; B29C 43/04
[52] U.S. Cl. ................... 264/151; 264/145; 264/167; 264/272.15; 264/272.17; 264/328.2; 264/328.4; 264/328.5
[58] Field of Search .......... 264/167, 267, , 328.2, 264/328.4, 328.5, 145, 151; 53/128, 140, 526, 553

[56] References Cited

U.S. PATENT DOCUMENTS

| 2,166,643 | 7/1939 | Salfisberg | 53/526 |
| 2,338,607 | 1/1944 | Wacker | 264/167 |
| 3,493,392 | 1/1970 | Kasmatsu et al. | 264/316 |
| 4,954,301 | 9/1990 | Saeki et al. | 264/328.4 |

Primary Examiner—Hubert C. Lorin
Assistant Examiner—Angela Ortiz
Attorney, Agent, or Firm—Edmund M. Jaskiewicz

[57] ABSTRACT

Method for packing a measured quantity of thermosetting resin, intended for encapsulating a component such as an integrated circuit by introducing this quantity into a flexible plastics covering which can be sealed airtight, and packing for a measured quantity of thermosetting resin intended for encapsulating a component.

4 Claims, 2 Drawing Sheets

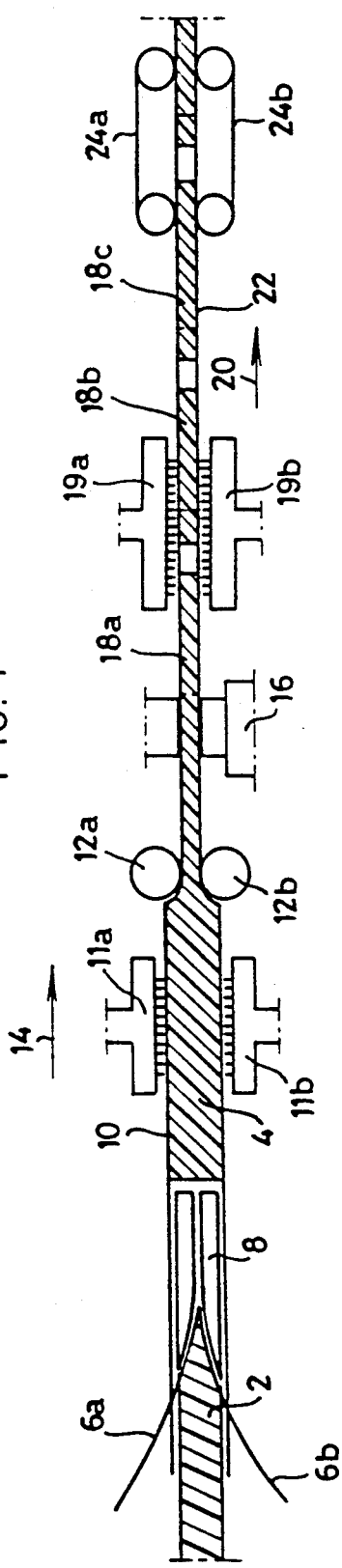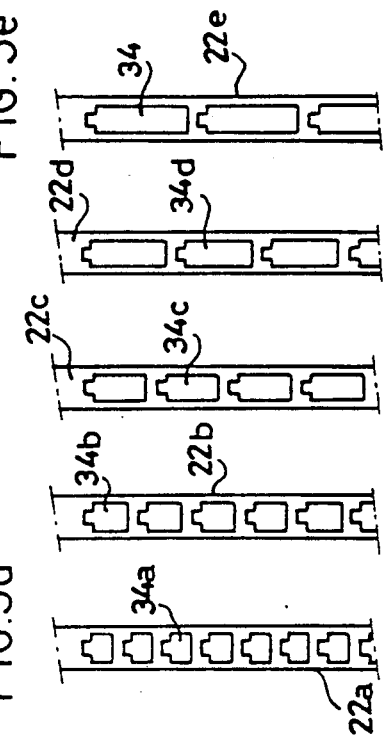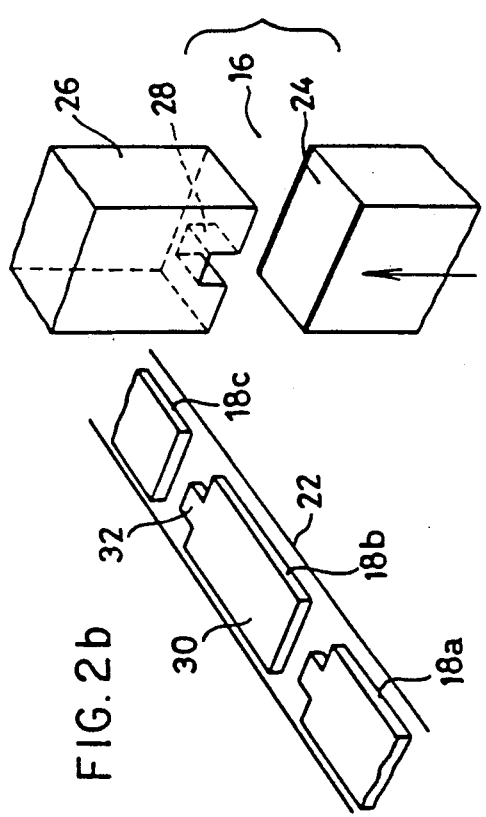

METHOD FOR PACKING A MEASURED QUANTITY OF THERMOSETTING RESIN AND OPERATING A MOLD FOR ENCAPSULATING A COMPONENT

BACKGROUND OF THE INVENTION

The invention relates to a method for packing a measured quantity of thermosetting resin, intended for encapsulating a component, in particular an integrated circuit.

DESCRIPTION OF THE PRIOR ART

The encapsulating of components, for example semiconductor components, is a technique which, although well-developed, nevertheless still has many imperfections. A thermosetting epoxy synthetic resin with a high content of high abrasive fillers is used for this encapsulating.

This starting material is extruded at a temperature of about 100° and then rolled; the rolled material is then cooled at ambient temperature and on cooling becomes hard and brittle. The cooled material is ground and/or chopped in a cutting mill to a certain fineness, the dust generated during this operation being drawn off by means of a suitable stream of air. Finally, the granulate thus obtained is deposited in containers and stored cooled.

When this material has to be used, it is first allowed to "acclimatise" slowly to room temperature; the material is then processed in accordance with the client's order to pills which each contain a quantity of material which is sufficient to encapsulate one or a certain number of components.

A number of these pills, again cooled, is then packed in a suitable container, during which operation care must be taken that the packing takes place in such a way that as little air as possible can enter. However, both during the shaping the pills and during the packing it is impossible to prevent a quantity of air nevertheless being present inside the pill and during injection of the material into the mould cavity this quantity of air will result in that the inflowing plastics acquires a foam structure. The gate must then be kept under pressure even after injection of the plastics in order to keep the occluded air compressed, which, however, demands a high closing pressure on the mould and gives rise to many problems in practice. Moreover, these pills are vulnerable and during the cooled transport thereof, during which the pills are frequently subjected to shocks and vibrations, damage occurs, as a result of which the quantity of material in a damaged pill will be smaller than the original amount. This gives rise to substantial problems during processing; the mould cavity is inadequately filled, while a damaged pill and/or a broken-off part thereof can block the pill feed mechanism in the automated casting equipment, so that breakdowns occur which lead to refuse and loss of production.

Another drawback of the processing of the plastics material according to the prior part is that the slightly hygroscopic plastics material easily absorbs moisture deposited thereon during processing, which has an adverse effect on the quality of the capsule finally obtained.

It is clear that the current method for production and processing of the epoxy material involving the numerous, frequently not completely controllable, steps is highly imperfect and these imperfections have a direct adverse influence on the quality of the end product.

SUMMARY OF THE INVENTION

The aim of the invention is to overcome all of these drawbacks. To this end the intended quantity is, according to the invention, introduced into a flexible plastics covering which can be sealed airtight.

Preferably the resin, supplied continuously by an extruder, is injected directly after issue, with exclusion of the surrounding air, into a thin-walled flexible tube, the tube, thus formed, is flat-rolled to a predetermined thickness and the inner walls of this tube which are opposite to one another are brought together at positions with predetermined spacings, such that there is always a predetermined quantity of plastics present between two successive positions.

In a preferred embodiment of this novel method the bringing together is carried out in such a way that two edge boundaries are formed which are located at a distance from one another and are transverse to the longitudinal edges of the tube, of which edge boundaries at least one has a bulge which defines an outflow spout and is directed towards the other edge boundary.

It is preferred that the tube is provided at regular intervals with printed information identifying the contents thereof.

The advantages achieved with the invention are numerous and can be summarized as follows:

During manufacture, the units, which still contain fluid compound, have to pass through only a short cooling path since an effective energy transfer is possible. Manufacturing is dust-free and there is thus also no further loss of material due to unusable dust and/or particles which are too small.

No grinding or chopping operations are needed and the processing units, which are not exposed to abrasive effects, are simple. The surrounding air can no longer exert an adverse effect and influence by, and absorbtion of, moisture is precluded, as is occlusion of air. The entire, short manufacturing line has excellent manageability and controllability; the subsequent detection of faults is also much simpler.

Further advantages of the packing are that coding is possible, with all its attendant advantages, while the freedom in shaping offers the possibility of selecting a shape which permits a simple pre-warming before injection. The strip-shaped packing offers the possibility of providing positioning markings, which promotes a rapid and reliable treatment thereof in the automated encapsulating machine. When a breakdown arises in a specific automated machine, this particular machine can be stopped without problems, without causing a blockage elsewhere in the processing system. When faults occur, this coding possibility of the compound package enables these to be traced afterwards.

Finally, a great advantage is that a very constant and accurate metering of the encapsulating material is possible.

Storage is appreciably simpler and more favourable; when the packing is damaged, only a minimum number of units of base material will be lost. There is no longer any need to wait until the compound stored in the cooled state has reached room temperature before processing, as a result of which incorrect processing is excluded. Checking the stock of stored compound is very simple, while it is no longer necessary for the user himself to produce the measured quantities of base material (as in the case of the pills) since transport and storage have become problem-free. The risk of crumbling, which is attendant when pills are used, no longer exists and there is likewise no danger that the homogeneity of the base material will be disturbed during distribution. Using the markings on the packing, it is possible to check whether the contents thereof correspond to what is indicated on the box.

Finally, great advantages are obtained during the processing of the material. The material no longer comes into direct contact with the injection mechanism; the highly abrasive fillers in the material are then also no longer able to damage this mechanism. Contamination of the injection machine will no longer occur and, consequently, no downtime for cleaning the machine will be necessary. When the injection has to be interrupted for any reason whatsoever before the entire packing has been pressed empty, the said packing can be removed without the injection mechanism having to be cleaned thereafter.

Since the variation in the quantity of material supplied is obtained by variation in the length of the packing, it is possible to supply the material in strips with an identical width for each unit quantity, as a result of which a universal feed mechanism can be used.

Since the bulge is in the injection channel during processing, all of the problems associated with loosening of the gate in the prior art are overcome. Since, moreover, the gate duct is no longer in contact with the lead frame, it is also possible to feed over the leads if desired; there is no longer any need to feed only via the corner in the case of certain shapes of encapsulations. Feeding can be effected without problems via the dividing plane of the mould, which appreciably simplifies mould construction.

The problems which arise in the state of the art when processing pills, such as leakage of the material to above the plunger with contamination and pressure loss, are, of course, completely absent.

Finally, the fact that the compound can be processed direct from cooling is a great advantage; the slow "acclimatization" of a closed package provided with a desiccant, such as is necessary with the state of the art, is dispensed with.

The invention furthermore provides a method for operating a casting mould for encapsulating a component, in particular an integrated circuit, with thermosetting resin, which mould is provided for each mould cavity with an injection channel connected to said cavity, using a packing according to the invention an individual packing being positioned with the outflow spout sealingly in the injection channel and being emptied by exerting pressure on the remaining section of the packing.

Preferably prior to emptying the packing the information present thereon and identifying the contents is read out.

Finally the invention relates to an injection channel suitable for receiving the outflow spout of the packing as used and by means for exerting pressure on the remaining section of the packing, preferably with means for reading out the information provided on the packing before the packing is emptied.

DESCRIPTION OF THE DRAWINGS

FIG. 1 is a schematic representation of an installation for carrying out the method according to the invention;

FIG. 2a is a schematic representation of a sealing device to illustrate a processing step in this method;

FIG. 2b is a schematic representation of the strip with individual packings to illustrate a processing step in this method;

FIGS. 3a to 3e show various configurations of the packing obtained using the method according to the invention;

DESCRIPTION OF PREFERRED EMBODIMENTS

Figure 4:
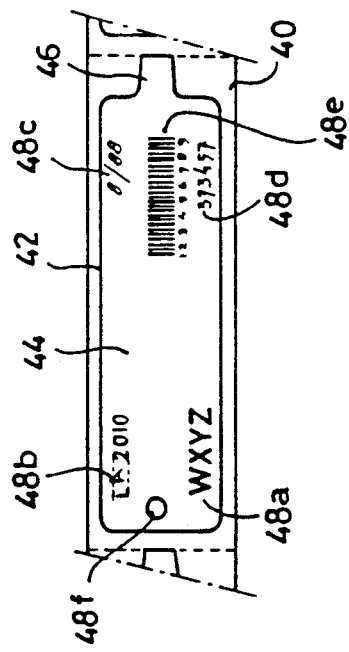
FIG. 4 shows a top view of an individual packing.

FIG. 1 shows schematically an extruder 2 which supplies the thermosetting plastics material (also termed "compound") to be packaged; the material issuing from this extruder is indicated by 4. This material is injected into a thin-walled, flexible plastics covering which is formed from two plastics films 6a, 6b, the edges of which are sealed to one another by means of a sealing device 8, so that a thin flexible tube 10 forms. This tube, filled over its entire cross-section with the plastics material 4 with the exclusion of air, is precooled by means of cold air supplied through the mouthpieces 11a, 11b, which are connected to a source, which is not shown, of cool air, and then flattened by two rollers 12a, 12b. The tube is driven by transport means, which are not shown, in the direction of the arrow 14 and beyond the rollers 12a, 12b passes a sealing device 16, which is shown in detail in FIG. 2a. The individual packings 18a, 18b which are formed here and are still connected to one another are finally cooled by cold air supplied through the schematically indicated mouthpieces 19a, 19b direction of the arrow 20 through a suitable transport device, indicated schematically by the two conveyor belts 24a, 24b.

FIG. 2b shows the strip 22 with the individual packings 18a, 18b, 18c obtained by sealing. By using a pair of seal electrodes comprising a plane bottom electrode 24 and a top electrode 26 in which a suitable rectangular, elongated recess 28 has been formed, each individual packing acquires a shape which consists of a rectangular body section 30 and a bulge 32 connecting thereon. When the front edge of this bulge 32 is cut off, an opening is formed from which the material present in the packing can flow out when pressure is applied to the body section 30.

The quantity of material present in each individual packing can be varied as desired by varying the length of the section of the flat-rolled tube which passes between two successive sealing operations of the sealing device 16.

FIG. 3a shows a strip 22a with short individual packings 34a therein; FIG. 3e shows a strip 22e with appreciably longer individual packings 34e. In-between sizes are shown at b, c and d.

FIG. 4 shows a top view of a strip 40 with a packing 42, which here also consists of the body section 44 with the bulge 46. As FIG. 4 shows, several pieces of printed information, indicated by 48a–48e, are provided on the packing. Of these, printed information 48e is a so-called bar code which, as is known, can contain a great deal of information and according to the invention is advantageously used to ascertain whether the packing contains the correct material before the contents of the packing are fed to a mould, while 48f is a positioning marking, for example produced as a reflecting dot.

Figure 5:
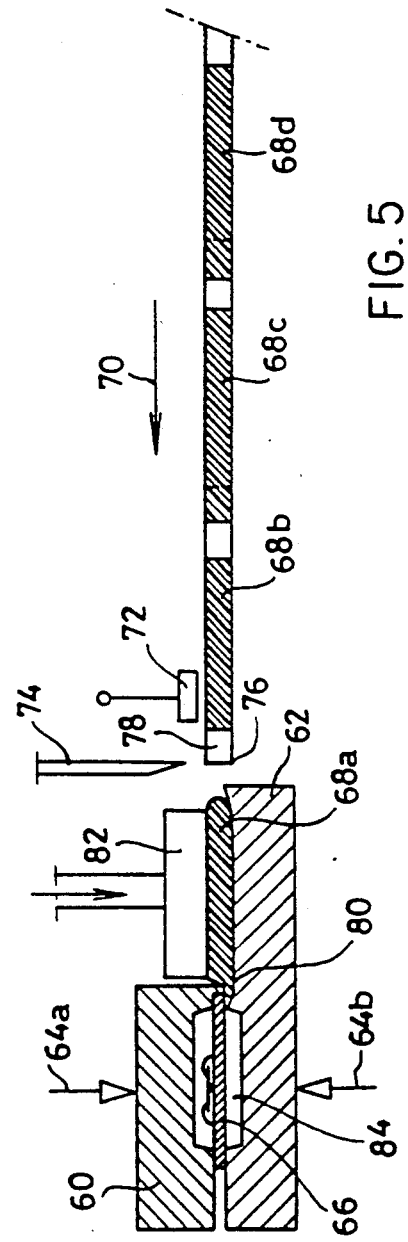
FIG. 5 shows schematically the use of the packing obtained according to the invention in combination with an installation for encapsulating, for example, semiconductor components.

FIG. 5 shows, very schematically, a mould with auxiliary equipment suitable for use in combination with the new packing according to the invention. In the conventional manner, the mould consists of the top half 60 and the bottom half 62; they are pressed against one another by means which are not shown and are symbolized by the arrows 64a, 64b, clamping a component, for example a semiconductor component 66, to be encapsulated. The quantity of material necessary for each individual "shot" is present in each of the packings supplied, a number of which are indicated by 68a..68d; they are supplied in the direction of the arrow 70. Each packing passes a bar code reader 72, which supplies an output signal corresponding to the bar code and which can be used, for example, to stop the installation when incorrect packings are supplied. The front edge 76 of the bulge 78 is cut off from each individual packing using a suitable cutting mechanism 74; after reaching the correct position at the mould, as indicated for the packing 68a, the bulge 78 lies in the injection channel 80 of the mould and, after exerting pressure on the body section of the packing by means of a device suitable for this purpose, indicated schematically by 82, the contents of the packing are pressed into the mould cavity 84.

Of course, many modifications in both use, design and configuration of the packings are possible within the framework of the invention. Thus, it is conceivable to shape packings which have a bulge at either end, so that packings of this type can be used in a double mould, two mould cavities being filled with plastics at the same time at each casting step. The shape of the body section can also be varied as desired and depending on the intended use.

What is claimed is:

1. Method for packing a measured quantity of thermosetting plastic for use in encapsulating an integrated circuit component, comprising introducing a plurality of measured quantities of thermosetting plastic supplied continuously from an extruder into a flexible plastic covering of indeterminate length and forming the length of flexible plastic into a thin-walled flexible tube including the thermosetting resin which is formed into a plurality of similar discreet units of resin in a strip, flat rolling the tube to a predetermined thickness to form opposite walls, bringing the opposite walls of the tube together to form edge boundaries which are transverse to the longitudinal edges of the tube, forming a bulge in an edge boundary to define an out-flow spout and directed toward the next edge boundary, sealing the plastic cover airtight around each of said units, and separating the sealed units from the strip prior to an encapsulating step.

2. Method for operating a casting mould for encapsulating an integrated circuit component with a thermosetting resin comprising supplying continuously the resin from an extruder into a thin-walled flexible plastic tube while excluding air therefrom, sealing the tube airtight, flat-rolling the tube to a predetermined thickness to form opposite walls, bringing the opposite walls of the tube together at predetermined distances such that there is a predetermined quantity of resin between two successive distances, bringing the opposite walls of the tube together to form edge boundaries which are transverse to the longitudinal edges of the tube, forming a bulge in the edge boundary to define an out-flow spout and directed toward the next edge boundary, positioning an individual sealed unit with its out-flow spout sealingly in an injection channel connected to a cavity of a mould, and exerting pressure on the remaining portion of the unit to empty the resin from the unit into the mould cavity.

3. Method according to claim 2 and the steps of providing on the covering at regular intervals printed information identifying the contents thereof, and reading the information on a unit to identify the contents thereof and then emptying the unit.

4. Method according to claim 2 wherein each of said units is defined by spaced transverse edges with respect to the longitudinal direction of the strip, and forming a bulge in a said transverse edge of a unit to define an out-flow spout and directed toward the next successive unit.

* * * * *